United States Patent [19]
Matsumoto et al.

[11] Patent Number: 5,270,978
[45] Date of Patent: Dec. 14, 1993

[54] NONVOLATILE MEMORY CIRCUIT

[75] Inventors: Osamu Matsumoto, Kawasaki; Kazuhiko Miki, Yokohama, both of Japan

[73] Assignee: Kabushiki Kaisha Toshiba, Kawasaki, Japan

[21] Appl. No.: 936,787

[22] Filed: Aug. 28, 1992

[30] Foreign Application Priority Data

Aug. 30, 1991 [JP] Japan .................. 3-219932

[51] Int. Cl.⁵ .................. G11C 7/00; G11C 13/00
[52] U.S. Cl. .................. 365/203; 365/205; 365/210
[58] Field of Search ............ 365/203, 189.01, 230.01, 365/210, 205

[56] References Cited

U.S. PATENT DOCUMENTS 5,001,668  3/1991  Ito et al. .
5,058,062  10/1991  Wada et al. .
5,138,579  8/1992  Tatsumi et al. .................. 365/203

FOREIGN PATENT DOCUMENTS 2-3191  1/1990  Japan .
2-7293  1/1990  Japan .

OTHER PUBLICATIONS

U.S. Patent Application 07/630,842 filed Dec. 20, 1990.

Primary Examiner—Terrell W. Fears
Attorney, Agent, or Firm—Finnegan, Henderson, Farabow, Garrett & Dunner

[57] ABSTRACT

The present invention relates to a precharge/discharge nonvolatile memory circuit for detecting signals output from two bit lines on read-cell and dummy cell sides using a flip-flop circuit, comprising a first row decoder on the read-cell side, a second row decoder on the dummy-cell side, a first column decoder on the read-cell side, a second column decoder on the dummy-cell side, a read cell selected by the first row decoder and the first column decoder, a dummy cell selected by the second row decoder and the second column decoder, first and second precharge transistors for performing a precharge operation, first and second discharge transistors for performing a discharge operation, the flip-flop circuit, a discharge control circuit for generating a discharge signal, and a precharge control circuit for generating a precharge signal after the discharge signal is generated from the discharge control circuit.

4 Claims, 11 Drawing Sheets

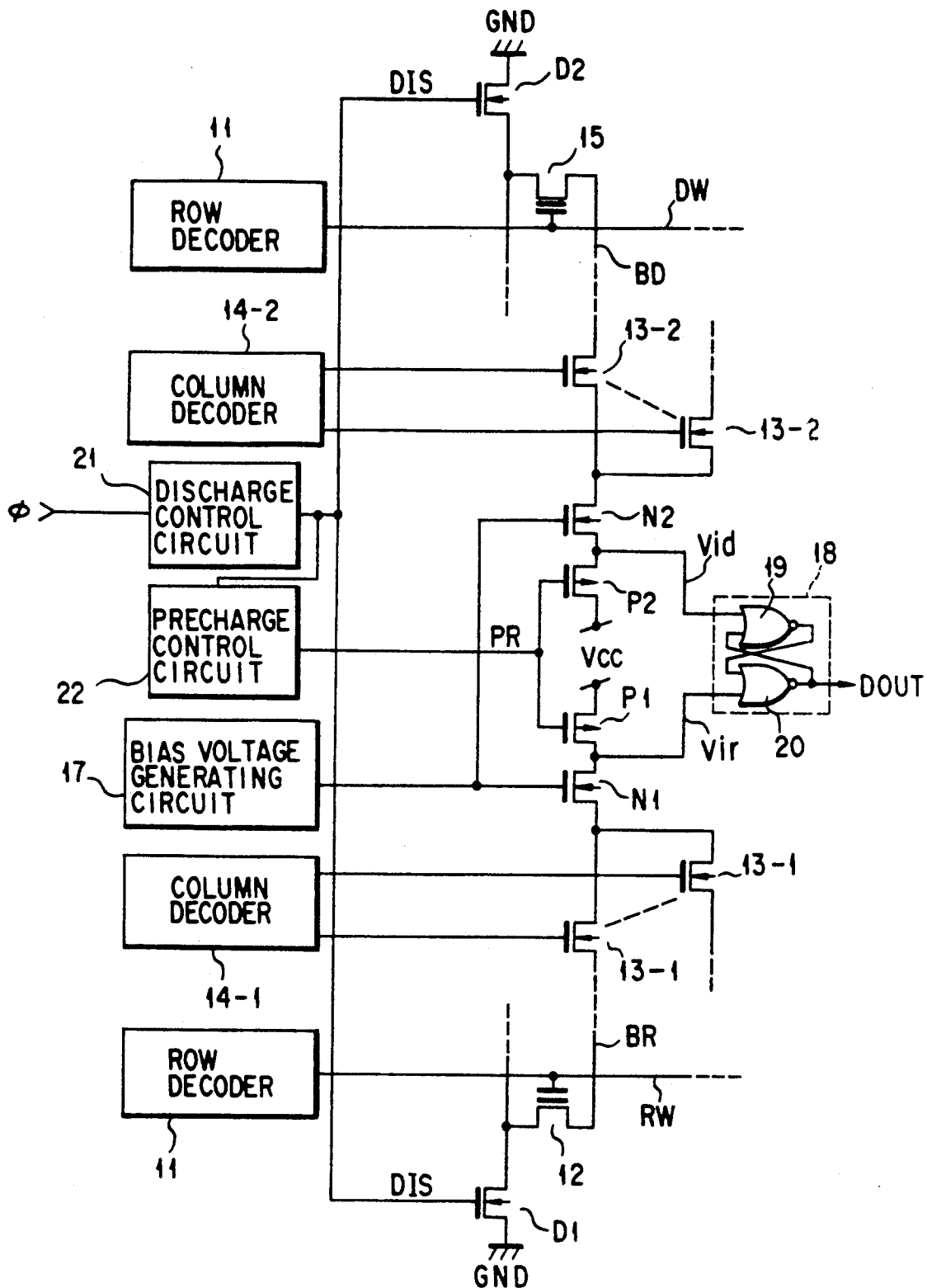
F I G. 1

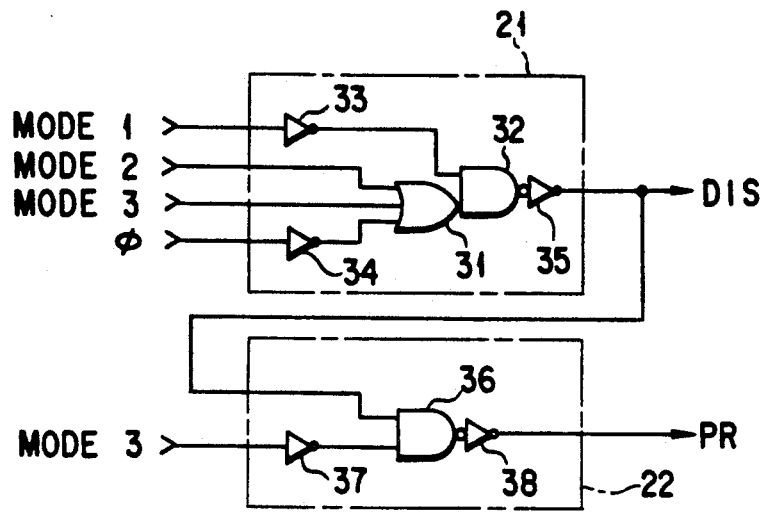
F I G. 3
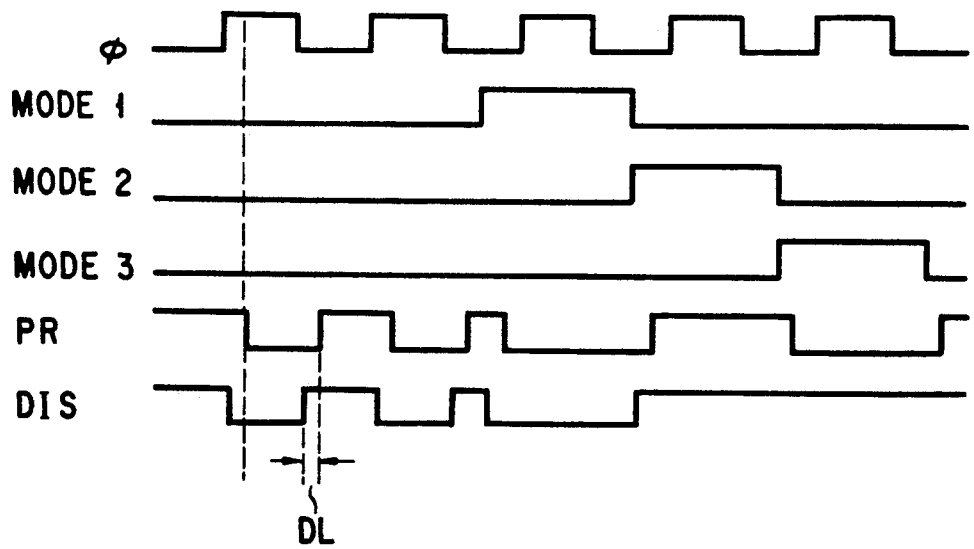
F I G. 4

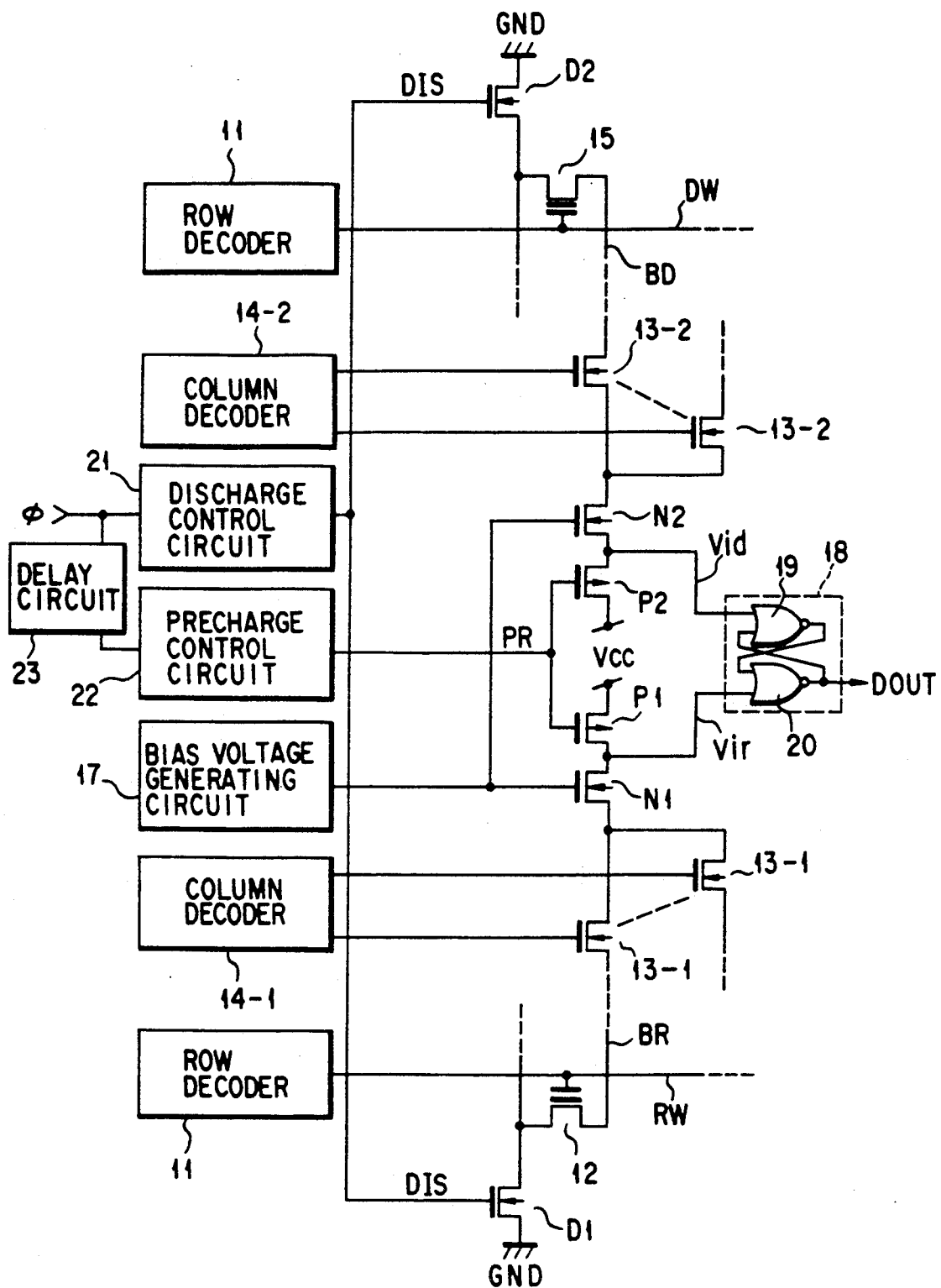
F I G. 5

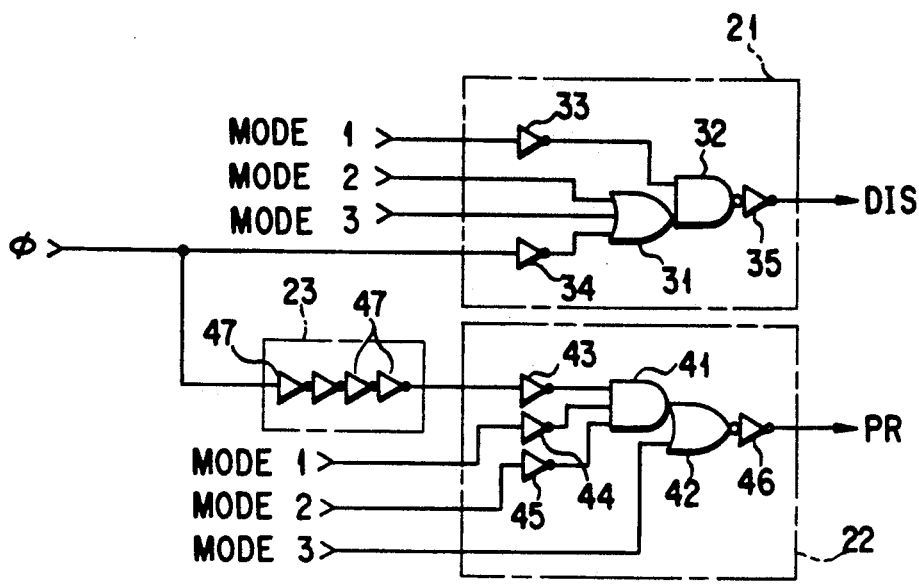
F I G. 6
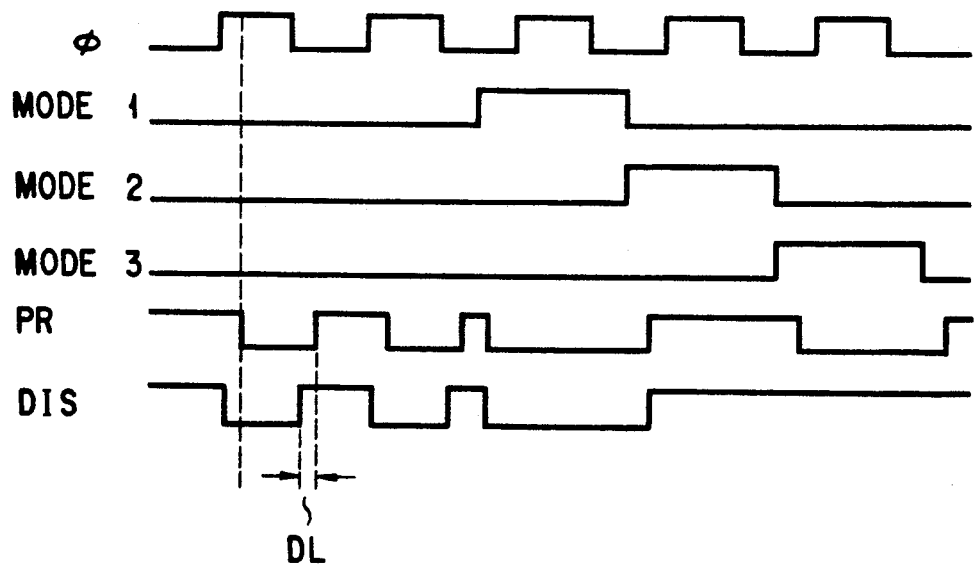
F I G. 7

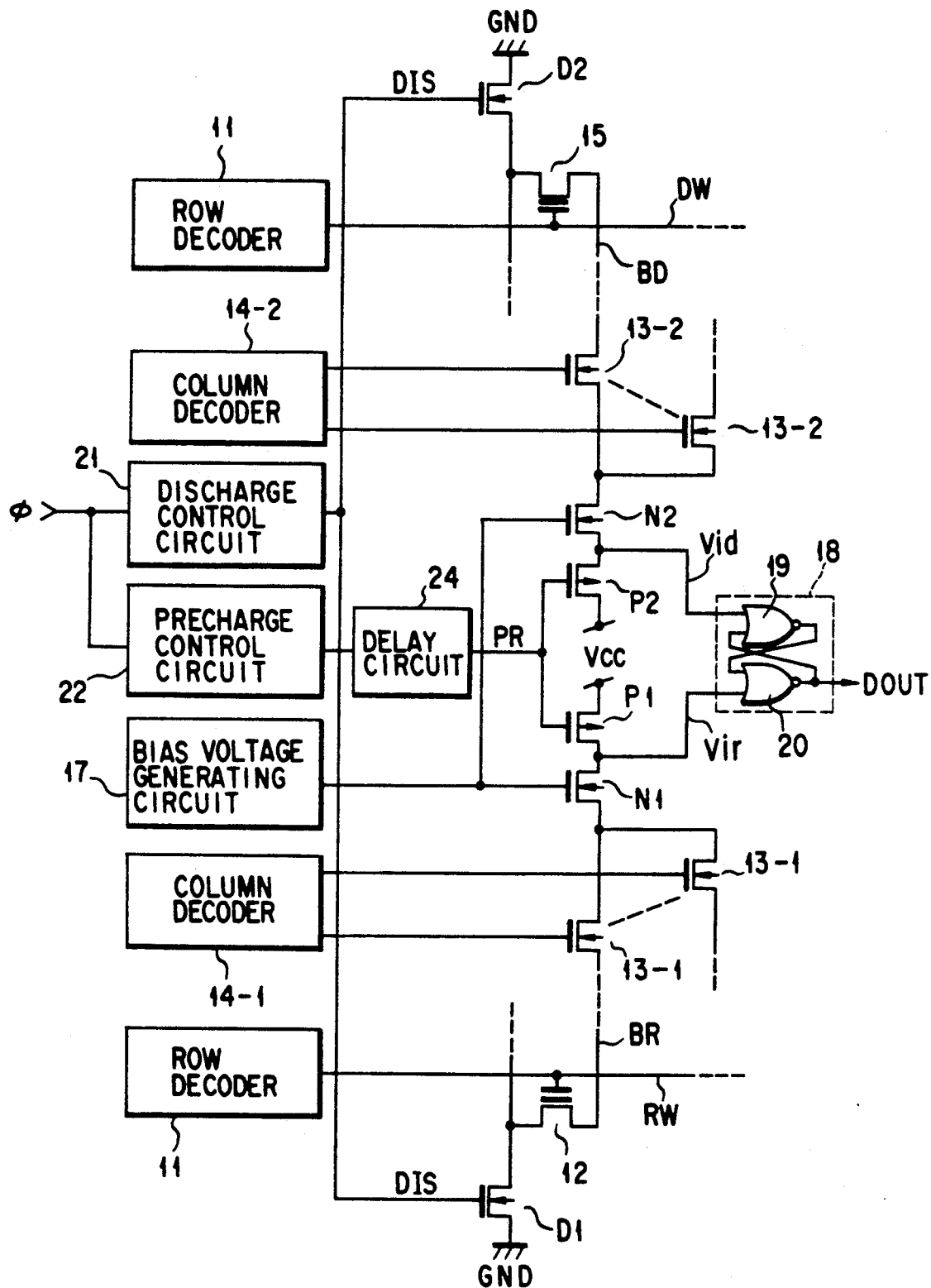
F I G. 8

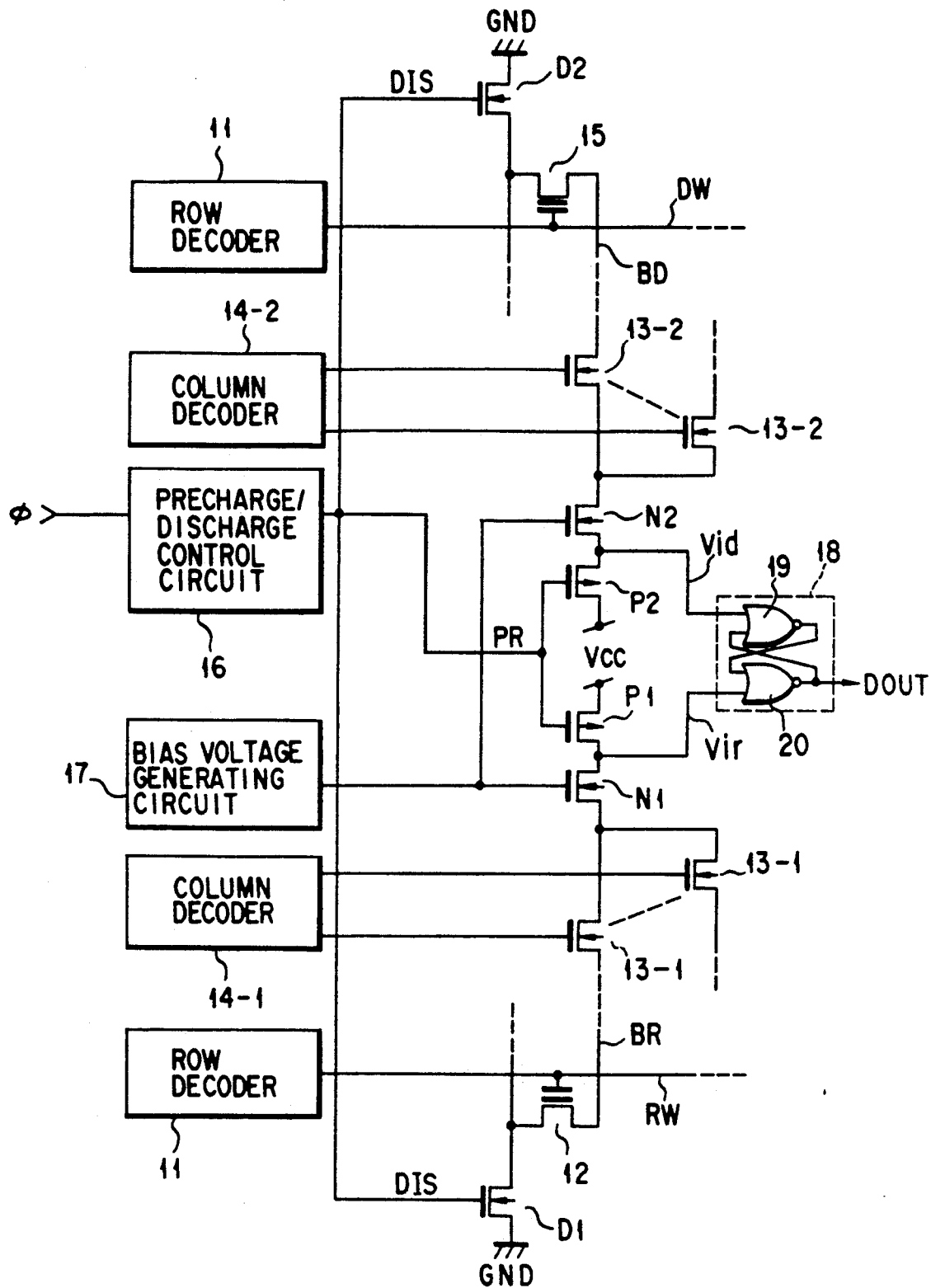
F I G. 13

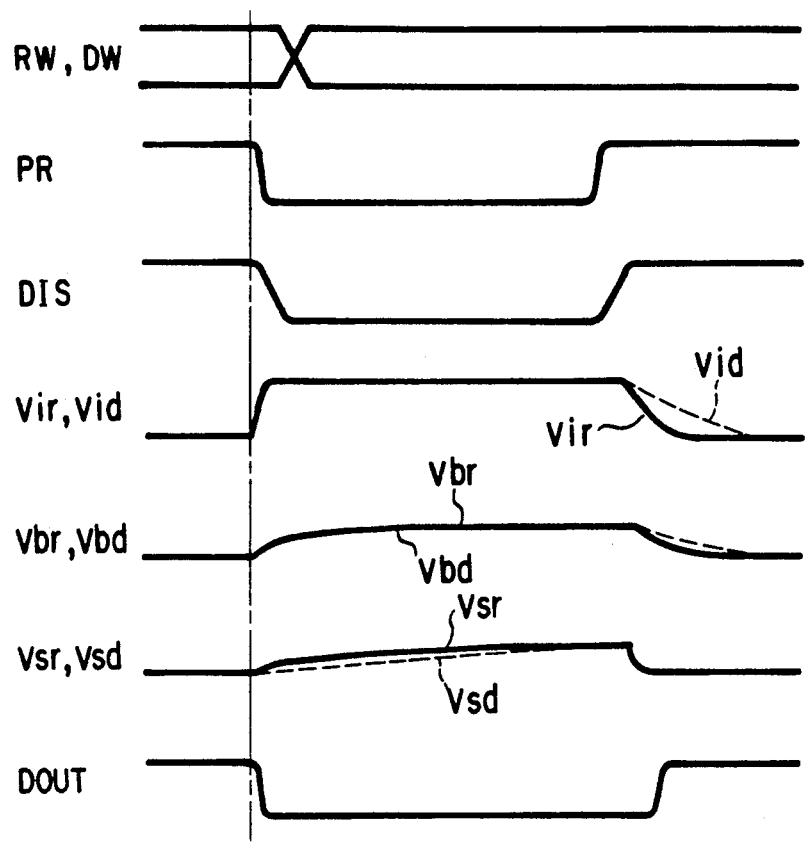
F I G. 16
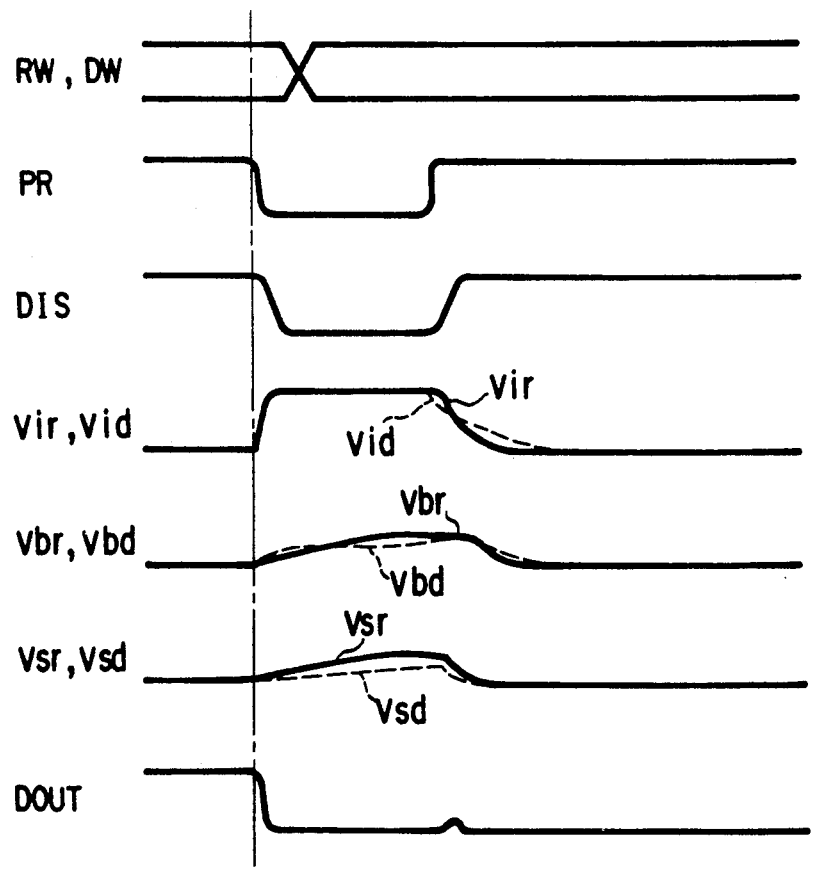
F I G. 17

NONVOLATILE MEMORY CIRCUIT

BACKGROUND OF THE INVENTION

1. Field of the Invention

The present invention relates to a precharge/discharge nonvolatile memory circuit such as an EPROM loaded in logic products such as a microcomputer.

2. Description of the Related Art

FIG. 13 is a circuit diagram showing an arrangement of a data readout system of a conventional precharge/discharge nonvolatile memory circuit. A row decoder 11 on the read-cell side selects one of plural word lines RW, and a row decoder on the dummy-cell side selects one of plural dummy word lines DW. A plurality of memory cells, that is, read cells 12 are connected at their control gates to the word lines RW. One end of a current path of each of the read cells 12 is connected to its corresponding bit line BR. A selective transistor 13-1 is arranged at the distal end of the bit line BR. The gate of the selective transistor 13-1 is supplied with an output signal of a column decoder 14-1 and therefore the selective transistor 13-1 is controlled by the column decoder 14-1.

A plurality of dummy cells 15 are connected at their control gates to the dummy word lines DW. One end of a current path of each of the dummy cells 15 is connected to its corresponding dummy bit line BD, and a selective transistor 13-2 is arranged at the distal end of the dummy bit line BD. The selective transistor 13-2 is thus controlled by a column decoder 14-2.

A precharge/discharge control circuit 16 supplies a precharge signal PR to the gates of P-channel precharge transistors P1 and P2 and supplies a discharge signal DIS to the gates of N-channel discharge transistors D1 and D2, in response to a clock signal $\phi$.

The sources of the precharge transistors P1 and P2 are connected to power supplies $V_{cc}$. The drain of the precharge transistor P1 is connected to a connection point between the drains of the selective transistors 13-1 through a transfer transistor N1. The drain of the precharge transistor P2 is connected to a connection point between the drains of the selective transistors 13-2 through a transfer transistor N2.

The gates of the transfer transistors N1 and N2 are supplied with an output signal of a bias voltage generator 17 to control these transfer transistors.

The sources of the discharge transistors D1 and D2 are connected to grounds GND. The drain of the discharge transistor D1 is connected to the other end of the current path of the read cell 12, while the drain of the discharge transistor D2 is connected to the other end of the current path of the dummy cell 15.

A flip-flop circuit 18 is arranged to serve as a circuit for outputting readout data, and its one input terminal Vir is a connection point of the drains of the precharge transistor P1 and the transfer transistor N1 and another input terminal Vid is a connection point of the drains of the precharge transistor P2 and the transfer transistor N2. The flip-flop circuit 18 includes two NOR gate circuits 19 and 20. The output of the NOR gate circuit 19 is connected to the input of the NOR gate circuit 20, while the input of the circuit 19 is connected to the output of the circuit 20. Readout data DOUT is supplied from the output of the NOR gate circuit 20. In addition, the flip-flop circuit 18 can be replaced with a circuit having two inverters, an input terminal of one of the inverters being connected to an output terminal of the other inverter, and an output terminal of the former inverter being connected to an input terminal of the latter inverter.

FIG. 14 is a circuit diagram showing a specific arrangement of the precharge/discharge control circuit 16 of the nonvolatile memory circuit shown in FIG. 13. The precharge/discharge control circuit 16 includes an AND circuit 61, a NAND circuit 62, and inverter circuits 63, 64 and 65. The respective signals input to and output from the circuit 16 are represented by the timing chart shown in FIG. 15. MODE 1 and MODE 2 are test mode signals and become high in level when the reliability of the circuit is checked. Therefore, a normal read mode is set when the MODE 1 and MODE 2 are both low in level.

FIGS. 16 and 17 are timing charts showing an operation of the conventional nonvolatile memory circuit shown in FIG. 13. In FIG. 16, a precharge period is sufficiently long. In FIG. 17, the operating frequency of the memory circuit is increased because of its design, and a precharge period is not sufficiently long.

The precharge transistors P1 and P2 are turned on during the precharge period during which the precharge signal $\overline{PR}$ and discharge signal DIS are low in level, as shown in FIGS. 16 and 17. Thus, potentials Vir and Vid of the input terminals of the flip-flop circuit 18, potential Vbr of the selected bit line BR, potential Vbd of the dummy bit line BD, and potentials Vsr and Vsd of the selected source lines are precharged. A difference is usually set between gm (reciprocal of on-resistance) of the read cell 12 and that of the dummy cell 15 (gm of read cell > gm of dummy cell). During the precharge period, the potentials Vbr and Vbd differ from each other in change in precharge level, and the potentials Vsr and Vsd also differ from each other in change in precharge level. Though the potentials Vbr and Vsr are higher than the potentials Vbd and Vsd, respectively (Vbr > Vbd, Vsr > Vsd), at the beginning of the precharge period, the difference in level between them is gradually reduced.

If the level of the precharge signal $\overline{PR}$ is changed from low to high, then that of the discharge signal DIS is changed from low to high, a discharge period starts. If there is a gap due to a wiring delay between the precharge signal $\overline{PR}$ and discharge signal DIS, each node precharged during the precharge period is dynamically held. The operation of the conventional precharge/discharge nonvolatile memory circuit shown in FIG. 13 in which no electrons are injected into a floating gate of the read cell 12, will now be described.

If the precharge period is sufficiently long as shown in FIG. 16, the precharge levels of the potential Vbr and Vvd and those of the potentials Vsr and Vsd are considerably increased so that Vbr is equal to Vbd and Vsr is equal to Vsd, the precharge period ends, and these potentials are dynamically held. In this case, no charge share occurs in the potentials. When the discharge period starts, a difference in gm between the read cell 12 and the dummy cell 15 is caused, and the input terminal Vir of the flip-flop circuit 18 inevitably reaches a sense level earlier than the input terminal Vid thereof. Consequently, normal readout data DOUT can be output from the flip-flop circuit 18.

If the precharge period is not sufficiently long, as shown in FIG. 17, the precharge period is changed to the discharge period with the precharge levels of the potentials Vbr and Vbd and those of the potentials Vsr and Vsd in an unbalanced state.

Since the capacity of the source line is relatively large, charge is shared with the source line, bit line, and input terminals of the flip-flop circuit, and thus the level of the input terminals is lowered. Since Vbr > Vbd on the bit line and Vsr > Vsd on the source line, Vir > Vid at the input terminals of the flip-flop circuit. Therefore, the level of the input terminals of the flip-flop circuit 18 is decreased to the sense level of the flip-flop circuit 18 with Vir higher than Vid (Vir > Vid) before Vid becomes higher than Vir (Vir < Vid) by the difference in gm between the read cell 12 and dummy cell 15.

The discharge starts, and the potentials of the input terminals of the flip-flop circuit 18 reach the sense level of the flip-flop circuit 18 with Vir higher than Vid (Vir > Vid) by the difference in gm between the read cell 12 and dummy cell 15 (gm of read cell > gm of dummy cell), though actually Vid has to be higher than Vir (Vir < Vid), resulting in malfunction in which read-out data DOUT of an on-state cell is output as that of an off-state cell.

As described above, since the conventional precharge/discharge nonvolatile memory circuit is not so designed as to have a sufficiently long precharge period, an imbalance is caused between the precharge levels of potentials on the read-cell and dummy-cell sides, and the precharge period is changed to the discharge period in the unbalanced state. For this reason, the precharge levels reach the sense level in reverse order, and the flip-flop circuit does not read out normal data.

SUMMARY OF THE INVENTION

The present invention has been developed in consideration of the above situation and its object is to provide a nonvolatile memory circuit capable of performing a stable data readout operation even though it does not have a sufficiently long precharge period.

According to the present invention, there is provided a precharge/discharge nonvolatile memory circuit having a flip-flop circuit for detecting signals output from two bit lines on read-cell and dummy cell sides, comprising:

a first row decoder on the read-cell side;
a second row decoder on the dummy-cell side;
a first column decoder on the read-cell side;
a second column decoder on the dummy-cell side;
a read cell selected by the first row decoder and the first column decoder;
a dummy cell selected by the second row decoder and the second column decoder;
first and second precharge transistors for performing a precharge operation;
first and second discharge transistors for performing a discharge operation;
the flip-flop circuit;
a discharge control circuit for generating a discharge signal; and
a precharge control circuit for generating a precharge signal after the discharge signal is generated from the discharge control circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a circuit diagram showing an arrangement of a precharge/discharge nonvolatile memory circuit according to a first embodiment of the present invention;

FIG. 3 is a circuit diagram showing a specific arrangement of circuits included in the circuit shown in FIG. 1;

FIG. 4 is a timing chart of signals representing an operation of the circuits shown in FIG. 3;

FIG. 5 is a circuit diagram showing an arrangement of a precharge/discharge nonvolatile memory circuit according to a second embodiment of the present invention;

FIG. 6 is a circuit diagram showing a specific arrangement of circuits included in the circuit shown in FIG. 5;

FIG. 7 is a timing chart of signals representing an operation of the circuits shown in FIG. 6;

FIG. 8 is a circuit diagram showing an arrangement of a precharge/discharge nonvolatile memory circuit according to a third embodiment of the present invention;

FIG. 13 is a circuit diagram showing an arrangement of a data readout system of a conventional precharge/discharge nonvolatile memory circuit;

FIG. 16 is a timing chart of signals representing an operation of the circuit shown in FIG. 13 under a first condition; and FIG. 17 is a timing chart of signals representing an operation of the circuit shown in FIG. 13 under a second condition.

DETAILED DESCRIPTION OF THE PREFERRED EMBODIMENTS

Embodiments of the present invention will now be described, with reference to the accompanying drawings.

FIG. 1 is a circuit diagram showing an arrangement of a data readout system of a precharge/discharge nonvolatile memory circuit according to a first embodiment of the present invention. This circuit differs from the conventional precharge/discharge nonvolatile memory circuit shown in FIG. 13 in that a discharge control circuit 21 and a precharge control circuit 22 are arranged separately from each other and the precharge control circuit 22 is operated in response to an output signal of the discharge control circuit 21. The other structural elements are the same as those of the conventional circuit and their descriptions are omitted.

Figure 2:
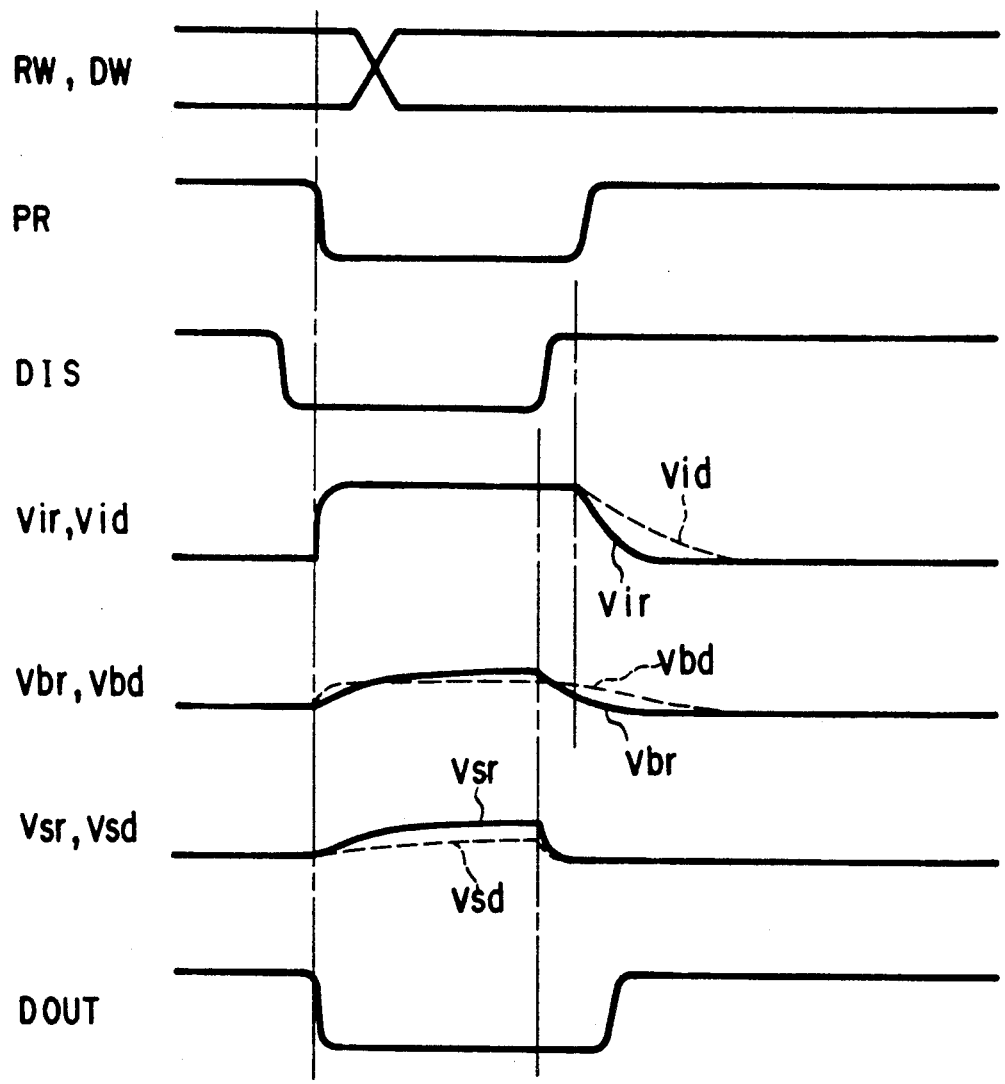
FIG. 2 is a timing chart of signals representing an operation of the circuit shown in FIG. 1.

FIG. 2 is a timing chart of signals representing an operation of the circuit shown in FIG. 1. The operation of the circuit will be described on condition that no electrons are injected into a floating gate of a read cell 12 as in the circuit shown in FIG. 13.

According to the first embodiment, a precharge signal $\overline{PR}$ is made later than the discharge signal DIS. Therefore, unlike the conventional circuit, a malfunction can be avoided even though the operating frequency of the circuit is high, and the precharge period is too short to sufficiently precharge the circuit.

Even if a difference in gm between a read cell and a dummy cell (gm of read cell > gm of dummy cell) causes an imbalance between precharge levels of potential Vbr of a selected bit line BR and potential Vbd of a dummy bit line BD and between those of potentials Vsr and Vsd of selected source lines (Vbr > Vbd, Vsr > Vsd), no charge share occurs in these potentials because there is no periods for dynamically holding each node.

When the discharge signal DIS changes in level from low to high and a discharge starts, the potentials Vsr and Vsd of the source lines, whose precharge levels are unbalanced, are set to the level of a ground voltage GND. The bit line BR and dummy bit line BD are equalized so that the potential Vbr of the former becomes lower than the potential Vbd of the latter by the difference in gm (gm of read cell > gm of dummy cell). Potentials Vir and Vid of input terminals of a flip-flop circuit 18 are held at the level of a power supply voltage Vcc until the precharge period ends.

When the precharge period ends, the flip-flop circuit 18 is discharged and the potentials Vir and Vid are dropped to the level of the ground voltage GND with Vir lower than Vid (Vid < Vid). This is because the gm of the read cell is larger than that of the dummy cell, and the bit line BR and dummy bit line BD are equalized so that the potential Vbr of the former is lower than the potential Vbd of the latter. Consequently, no malfunction occurs, and data can stably be read out.

FIG. 3 is a circuit diagram showing a specific arrangement of the discharge control circuit 21 and precharge control circuit 22 incorporated in the circuit shown in FIG. 1. The discharge control circuit 21 includes an OR circuit 31, a NAND circuit 32, and inverters 33, 34 and 35. The precharge control circuit 22 includes a NAND circuit 36, and inverters 37 and 38.

An inverted signal of MODE 1 is supplied to one input terminal of the NAND circuit 32 through the inverter 33, and an output terminal of the OR circuit 31 is connected to the other input terminal of the NAND circuit 32. The OR circuit has three input terminals to which signals of MODE 2 and MODE 3 are supplied and a clock signal $\phi$ is supplied through the inverter 34. An output terminal of the NAND circuit 32 issues a discharge signal DIS through the inverter 35. The discharge signal DIS is supplied to one input terminal of the NAND circuit 36 of the precharge control circuit 22, and an inverted signal of MODE 3 is supplied to the other input terminal of the NAND circuit 36 through the inverter 37. An output terminal of the NAND circuit 36 issues a precharge signal $\overline{PR}$ through the inverter 36.

The above signals are represented by the timing chart shown in FIG. 4. MODEs 1, 2 and 3 are test mode signals and become high in level when the reliability of the circuit is checked. When all the test mode signals are low in level, a normal read mode is set. In this read mode, the precharge signal PR is delayed (DL in FIG. 4) so that discharge starts before the precharge signal $\overline{PR}$ stops. Therefore, a malfunction can be prevented.

FIG. 5 is a circuit diagram showing a data readout system of a precharge/discharge nonvolatile memory circuit according to a second embodiment of the present invention.

The circuit of the second embodiment differs from that of the first embodiment in that it has a delay circuit 23. The delay circuit 23 receives a clock signal $\phi$ and transmits an output signal to the precharge control circuit 22. The operation of the circuit shown in FIG. 5 is the same as that of the circuit shown in FIG. 1 and can be represented by the timing chart shown in FIG. 2. Even though the precharge signal PR is made later than the discharge signal DIS and the memory circuit is not sufficiently precharged, a malfunction of the conventional circuit can be avoided in this second embodiment.

FIG. 6 is a circuit diagram showing a specific arrangement of the discharge control circuit 21, precharge control circuit 22 and delay circuit 23 incorporated in the circuit shown in FIG. 5. The discharge control circuit 21 has the same arrangement of the circuit shown in FIG. 3. The precharge control circuit 22 includes an AND circuit 41, a NOR circuit 42, and inverters 43 to 46. The delay circuit 23 includes a plurality of inverters 47 connected in series.

The AND circuit 41 of the precharge control circuit 22 has first to third input terminals. The first input terminal is supplied with a clock signal $\phi$ through the delay circuit 23 and inverter 43. The second and third input terminals are supplied with signals of MODE 1 and MODE 2 through the inverters 44 and 45, respectively.

An output terminal of the AND circuit 41 is connected to one input terminal of the NOR circuit 42, and a signal of MODE 3 is supplied to the other input terminal of the NOR circuit 42. An output terminal of the NOR circuit 42 issues a precharge signal PR through the inverter 46.

The above signals are represented by the timing chart shown in FIG. 7. MODEs 1, 2 and 3 are test mode signals which are the same as those shown in FIG. 4. As indicated by DL in FIG. 7, the precharge signal $\overline{PR}$ is delayed and output behind the discharge signal DIS.

FIG. 8 is a circuit diagram showing a data readout system of a precharge/discharge nonvolatile memory circuit according to a third embodiment of the present invention.

In the circuit shown in FIG. 8, a delay circuit 24 is arranged after a precharge control circuit 22, though the delay circuit 23 shown in FIG. 5 is arranged before the precharge control circuit 22. A precharge signal $\overline{PR}$ output from the precharge control circuit 22 is directly delayed. The operation of the circuit shown in FIG. 8 is also the same as that of the circuit shown in FIG. 1 and can be represented by the timing chart shown in FIG. 2. Even though the precharge signal $\overline{PR}$ is made later than the discharge signal DIS and the memory circuit is not sufficiently precharged, a malfunction of the conventional circuit can be avoided in the third embodiment.

Figure 9:
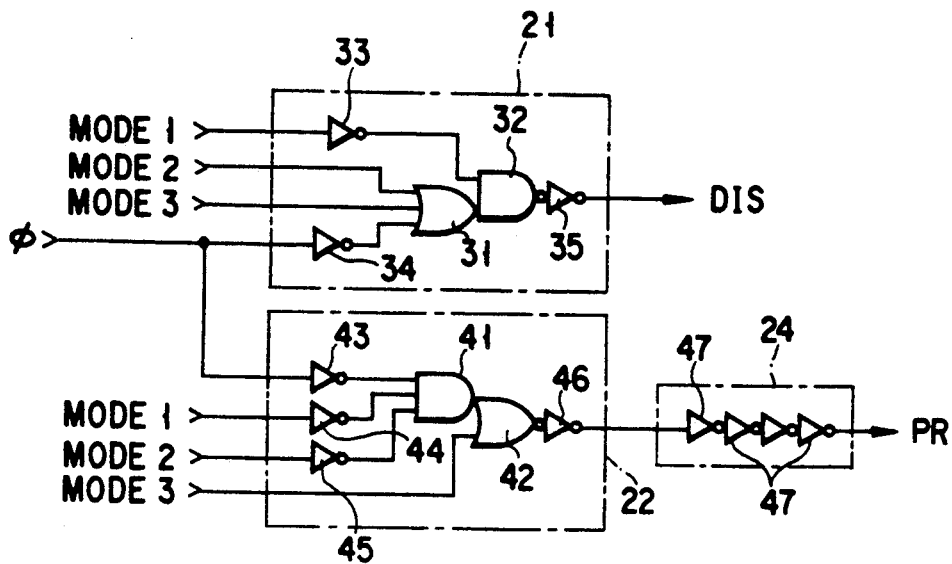
FIG. 9 is a circuit diagram showing a specific arrangement of circuits included in the circuit shown in FIG. 8.

FIG. 9 is a circuit diagram showing a specific arrangement of the discharge control circuit 21, precharge control circuit 22 and delay circuit 24 incorporated in the circuit shown in FIG. 8. These circuits have the same arrangements as those of the circuits shown in FIG. 6. However, the delay circuit shown in FIG. 6 is interposed between the input terminal of the clock signal $\phi$ and the inverter 43 of the precharge control circuit 22, while the delay circuit 24 shown in FIG. 9 is arranged after the inverter 46 of the precharge control circuit 22.

Figure 10:
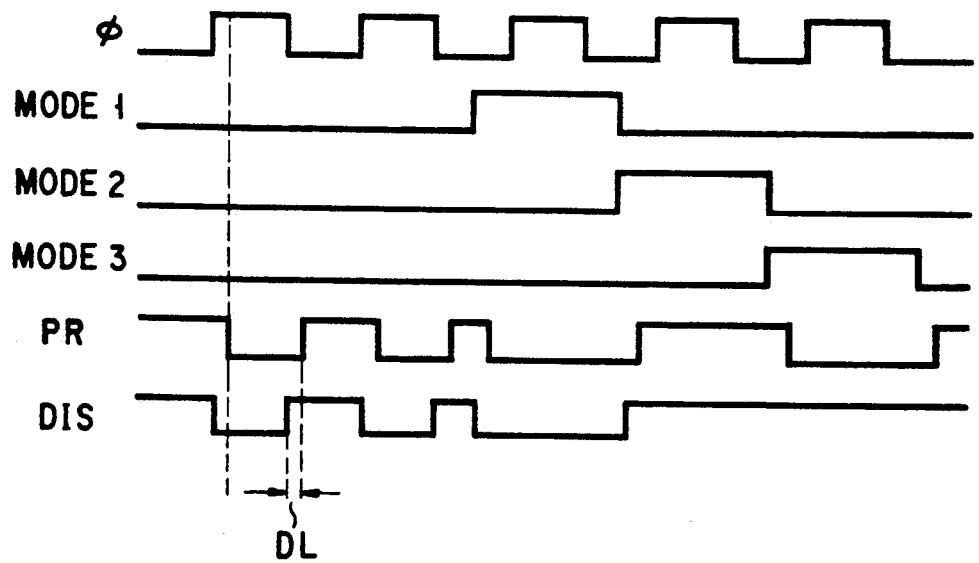
FIG. 10 is a timing chart of signals representing an operation of the circuits shown in FIG. 9.

The above signals are represented be the timing chart shown in FIG. 10. MODEs 1, 2 and 3 are test mode signals which are the same as those shown in FIG. 4. As indicated by DL in FIG. 10, the precharge signal PR is delayed and output behind the discharge signal DIS.

Figure 11A:
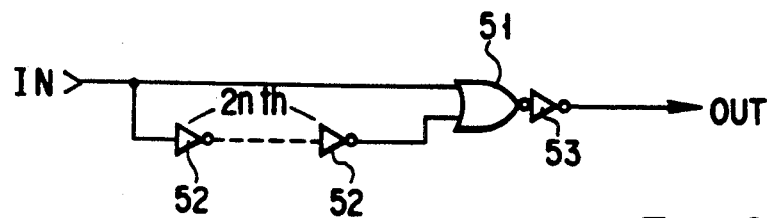
FIG. 11A is a circuit diagram showing another arrangement of one of the circuits shown in FIG. 6.
Figure 11B:
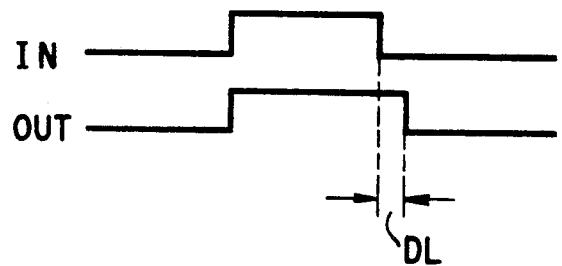
FIG. 11B is a view of waveforms showing an operation of the circuit shown in FIG. 11A.

FIG. 11A is a circuit diagram showing another arrangement of the delay circuit 23 incorporated in the circuit shown in FIG. 5. In the circuit shown in FIG. 11A, a signal IN is directly supplied to one input terminal of a NOR circuit 51, and a signal IN delayed by an even number of inverters 52 is supplied to the other input terminal of the NOR circuit 51. An output terminal of the NOR circuit 51 issues a signal OUT through an inverter 53. An operation of the circuit shown in FIG. 11 is represented by the timing chart shown in FIG. 11B. According to this operation, only the fall of the clock signal &U can be delayed, and only the rise of the precharge signal PR can be delayed.

Figure 12A:
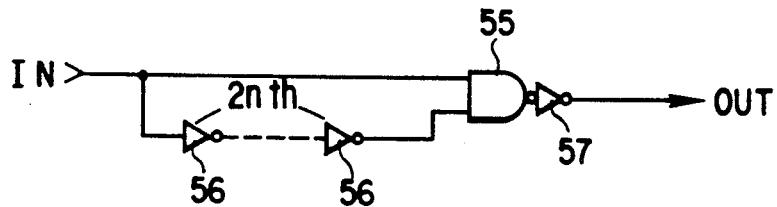
FIG. 12A is a circuit diagram showing another arrangement of one of the circuits shown in FIG. 9.
Figure 12B:
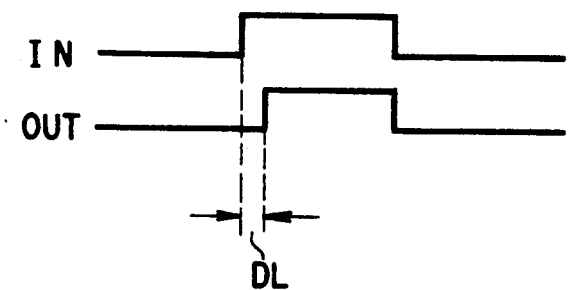
FIG. 12B is a view of waveforms showing an operation of the circuit shown in FIG. 12A.
Figure 14:
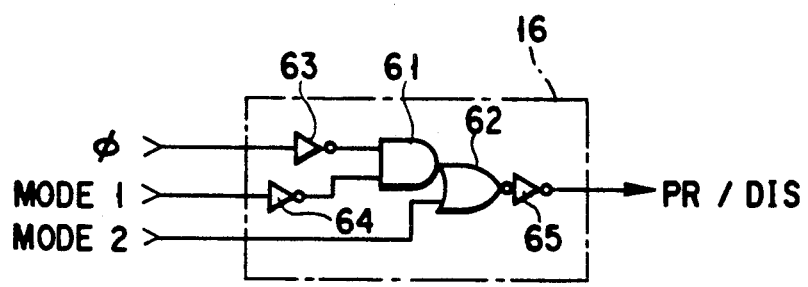
FIG. 14 is a circuit diagram showing a specific arrangement of a circuit included in the circuit shown in FIG. 13.
Figure 15:
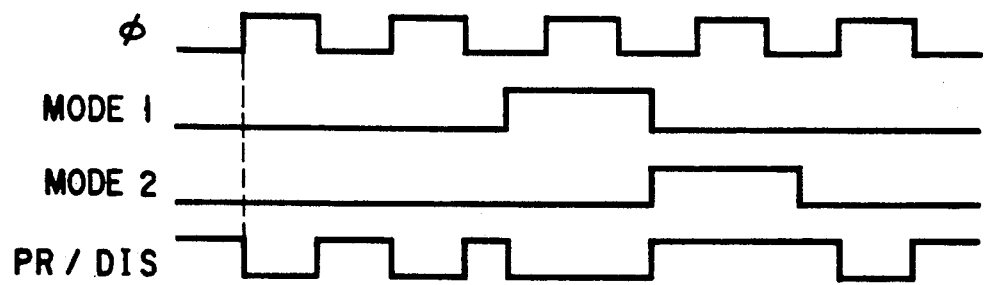
FIG. 15 is a timing chart of signals representing an operation of the circuit shown in FIG. 14.

FIG. 12A is a circuit diagram showing another arrangement of the delay circuit 24 incorporated in the circuit shown in FIG. 8. In the circuit shown in FIG. 12A, a signal IN is directly supplied to one input terminal of a NAND circuit 55, and a signal IN delayed by an even number of inverters 56 is supplied to the other input terminal of the NAND circuit 55. An output terminal of the NAND circuit 55 issues a signal OUT through an inverter 57. An operation of the delay circuit shown in FIG. 12A is represented by the timing chart of FIG. 12B. As is seen from FIG. 12B, only the rise of the precharge signal PR can be delayed.

According to the embodiments described above, since the precharge period and discharge period overlap each other, the unbalanced precharge levels of the source and bit lines, which are caused by the difference in gm between the read and dummy cells during the precharge period, are equalized to have a normal level. Consequently, a malfunction due to the charge share caused by a gap between the precharge and discharge periods can be prevented, and a stable data readout operation can be performed.

As has been described above, according to the present invention, since the discharge starts before the precharge signal stops, the charge share due to an imbalance of the precharge levels of the bit and source lines is eliminated, and the imbalance is corrected on the read-cell and dummy-cell sides during an overlap period of the precharge and discharge periods. It is thus possible to provide a reliable nonvolatile memory circuit capable of stable data readout.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A precharge/discharge nonvolatile memory circuit for detecting signals output from two bit lines on read-cell and dummy cell sides using a flip-flop circuit, comprising:

a first row decoder on the read-cell side;

a second row decoder on the dummy-cell side;

a first column decoder on the read-cell side;

a second column decoder on the dummy-cell side;

a read cell selected by said first row decoder and said first column decoder;

a dummy cell selected by said second row decoder and said second column decoder;

first and second precharge transistors for performing a precharge operation;

first and second discharge transistors for performing a discharge operation;

said flip-flop circuit;

a discharge control circuit for generating a discharge signal; and a precharge control circuit for generating a precharge signal after the discharge signal is generated from said discharge control circuit.

2. The circuit according to claim 1, wherein said precharge control circuit receives the discharge signal from said discharge control circuit and generates the precharge signal.

3. The circuit according to claim 1, wherein said discharge control circuit and said precharge control circuit receive a clock signal and generate the discharge signal and the precharge signal, and supply the clock signal to said precharge control circuit, said precharge control circuit receiving the clock signal later than said discharge control signal.

4. The circuit according to claim 3, wherein said clock signal is supplied to said precharge control circuit through a delay circuit.

* * * * *